(12) United States Patent
Haensch et al.

(10) Patent No.: US 9,385,050 B2
(45) Date of Patent: Jul. 5, 2016

(54) STRUCTURE AND METHOD TO FABRICATE RESISTOR ON FINFET PROCESSES

(75) Inventors: Wilfried Ernst-August Haensch, Somers, NY (US); Pranita Kulkarni, Slingerlands, NY (US); Tenko Yamashita, Schenectady, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 178 days.

(21) Appl. No.: 12/985,669

(22) Filed: Jan. 6, 2011

(65) Prior Publication Data

US 2012/0175749 A1 Jul. 12, 2012

(51) Int. Cl.
| | |
|---|---|
| *H01L 29/06* | (2006.01) |
| *H01L 21/84* | (2006.01) |
| *H01L 27/12* | (2006.01) |

(52) U.S. Cl.
CPC .......... *H01L 21/845* (2013.01); *H01L 27/1211* (2013.01)

(58) Field of Classification Search
CPC .......................... H01L 21/845; H01L 27/1211
USPC ........................... 257/536, 537, 538, 623, 624
See application file for complete search history.

(56) References Cited

U.S. PATENT DOCUMENTS

| | | | |
|---|---|---|---|
| 3,654,580 A | 4/1972 | Laisi | |
| 5,315,143 A * | 5/1994 | Tsuji | H01L 27/092 257/351 |
| 6,413,802 B1 * | 7/2002 | Hu et al. | 438/151 |
| 6,458,662 B1 * | 10/2002 | Yu | H01L 29/66795 257/E29.298 |
| 6,525,403 B2 * | 2/2003 | Inaba et al. | 257/618 |
| 6,706,571 B1 * | 3/2004 | Yu | H01L 29/4908 257/E29.151 |
| 6,787,406 B1 * | 9/2004 | Hill et al. | 438/164 |
| 6,853,020 B1 * | 2/2005 | Yu | H01L 21/26586 257/250 |
| 6,963,843 B1 | 11/2005 | Takatsu et al. | |
| 7,064,413 B2 | 6/2006 | Fried et al. | |
| 7,087,506 B2 | 8/2006 | Anderson et al. | |
| 7,129,550 B2 * | 10/2006 | Fujiwara et al. | 257/401 |

(Continued)

FOREIGN PATENT DOCUMENTS

| | | |
|---|---|---|
| CN | 1518771 A | 8/2004 |
| CN | 101764158 A | 6/2010 |

(Continued)

OTHER PUBLICATIONS

H.-S.P. Wong, "Beyond the Conventional Transistor," IBM Journal of Research and Development, Mar./May 2002, pp. 133-168, vol. 46, No. 2/3.

(Continued)

*Primary Examiner* — Jay C Kim
(74) *Attorney, Agent, or Firm* — Scully Scott Murphy and Presser; Frank Digiglio (57) ABSTRACT

A structure comprises first and at least second fin structures are formed. Each of the first and at least second fin structures has a vertically oriented semiconductor body. The vertically oriented semiconductor body is comprised of vertical surfaces. A doped region in each of the first and at least second fin structures is comprised of a concentration of dopant ions present in the semiconductor body to form a first resistor and at least a second resistor, and a pair of merged fins formed on outer portions of the doped regions of the first and at least second fin structures. The pair of merged fins is electrically connected so that the first and at least second resistors are electrically connected in parallel with each other.

20 Claims, 11 Drawing Sheets

(56) References Cited

U.S. PATENT DOCUMENTS

| | | | |
|---|---|---|---|
| 7,173,310 B2 | 2/2007 | Voldman et al. | |
| 7,202,517 B2 | 4/2007 | Dixit et al. | |
| 7,241,649 B2 | 7/2007 | Donze et al. | |
| 7,329,913 B2 | 2/2008 | Brask et al. | |
| 7,358,121 B2* | 4/2008 | Chau et al. | 438/149 |
| 7,923,788 B2* | 4/2011 | Ohguro et al. | 257/401 |
| 7,932,551 B2* | 4/2011 | Kim | H01L 27/115 257/314 |
| 8,021,949 B2* | 9/2011 | Cheng | H01L 21/26586 257/220 |
| 8,163,635 B2* | 4/2012 | Sugitani | H01L 21/26513 257/E21.334 |
| 8,187,928 B2* | 5/2012 | Yu | H01L 21/2236 257/302 |
| 8,217,450 B1* | 7/2012 | Yu | H01L 29/785 257/331 |
| 8,664,720 B2* | 3/2014 | Shrivastava et al. | 257/347 |
| 2004/0159910 A1 | 8/2004 | Fried et al. | |
| 2004/0253775 A1 | 12/2004 | Achuthan et al. | |
| 2005/0118824 A1 | 6/2005 | Achuthan et al. | |
| 2007/0018239 A1 | 1/2007 | Chen et al. | |
| 2007/0040221 A1 | 2/2007 | Gossner et al. | |
| 2007/0218661 A1 | 9/2007 | Shroff et al. | |
| 2007/0235819 A1* | 10/2007 | Yagishita | 257/401 |
| 2008/0237675 A1 | 10/2008 | Doyle et al. | |
| 2008/0277729 A1 | 11/2008 | Gossner et al. | |
| 2009/0065869 A1 | 3/2009 | Ohguro et al. | |
| 2010/0133614 A1 | 6/2010 | Beyer et al. | |
| 2010/0155842 A1 | 6/2010 | Anderson et al. | |
| 2010/0301417 A1 | 12/2010 | Cheng et al. | |
| 2012/0208328 A1 | 8/2012 | Anderson et al. | |
| 2013/0171780 A1 | 7/2013 | Anderson et al. | |

FOREIGN PATENT DOCUMENTS

| | | |
|---|---|---|
| DE | 102005039365 A1 | 2/2007 |
| GB | 2419232 A | 4/2006 |
| JP | 2003347414 A | 12/2003 |
| JP | 2007500456 A | 1/2007 |
| JP | 2007053387 A | 3/2007 |
| JP | 2009016525 A | 1/2009 |
| JP | 2010153860 A | 7/2010 |
| JP | 2011040768 A | 2/2011 |
| KR | 1020060020674 A | 3/2006 |
| KR | 20100073979 A | 7/2010 |
| WO | 2004112105 A2 | 12/2004 |
| WO | PCTUS1166466 | 4/2012 |

OTHER PUBLICATIONS

M. Poljak et al., "SOI vs. Bulk FinFET: Body Doping and Corner Effects Influence on Device Characteristics," IEEE Molecon, 2008, pp. 425-430.

Monica Heger, "Big Picture: Life After Silicon—How Graphene Could Revolutionize Electronics," http://discovermagazine.com/2009/jun/04-life-after-silicon/article_print, May 2009, 2 pages.

Robert S. Chau, "Integrated CMOS Tri-Gate Transistors: Paving the Way to Future Technology Generations," Technology @ Intel Magazine, Aug. 2006, pp. 1-7.

U.S. Appl. No. 12/793,292, filed in the name of Hensch et al. on Jun. 3, 2010 and entitled "FinFETCompatible Metal-Insulator-Metal Capacitor."

* cited by examiner

STRUCTURE AND METHOD TO FABRICATE RESISTOR ON FINFET PROCESSES

FIELD OF THE INVENTION

The present invention relates to semiconductor structures including resistors that are compatible with finFET structures and methods of manufacturing the same.

BACKGROUND OF THE INVENTION

The push for ever increasing device densities is particularly strong in complementary metal oxide semiconductor (CMOS) technologies such as in the design and fabrication of field effect transistors (FETs). FETs are the basic electrical devices of today's integrated circuits and are used in almost all types of integrated circuit design (e.g., microprocessors, memory, etc.). FETs may be formed on conventional substrates.

The advent of finFETs, i.e., field effect transistors formed on semiconductor fins having a height greater than the width, has altered the processing steps of conventional planar field effect transistors significantly. For example, semiconductor fins are formed by patterning a top semiconductor layer of a semiconductor-on-insulator (SOI) substrate. Thus, the conventional planar capacitor that employs an upper portion of a semiconductor substrate as a lower plate cannot be formed on a substrate including finFETs.

Resistors are devices that have electrical resistance associated with the device. Resistors are typically employed in an electrical device for protection, operation and/or current control. Hence, resistors play an important part in current analog and digital circuit designs. Using a fin-based technology would require a redesign of current CMOS resistor schemes for buried resistors (BRs), overpass resistors (Ops) and silicide resistors.

SUMMARY OF THE INVENTION

The present invention relates to semiconductor structures including resistors that are compatible with finFET structures and methods of manufacturing the same. One aspect of the present invention is to provide a technique of fabricating a parallel resistor circuit on a standard finFET process. For example, in a first aspect, the structure of the parallel resistor semiconductor comprises first and at least second fin structures. Each of the first and at least second fin structures has a vertically oriented semiconductor body. The vertically oriented semiconductor body comprises vertical surfaces. The structure further comprises a doped region in each of the first and at least second fin structures. A concentration of dopant ions is present in the semiconductor body to form a first resistor and at least a second resistor. The structure further comprises a pair of merged fins formed on outer portions of the doped regions of the first and at least second fin structures. The pair of merged fins is electrically connected so that the first and at least second resistors are electrically connected in parallel with each other.

In a second aspect of the invention, a method of forming a structure comprises forming first and at least second fin structures. Each of the first and at least second fin structures has a vertically oriented semiconductor body. The vertically oriented semiconductor body comprises vertical surfaces. The method further comprises forming a doped region in each of the first and at least second fin structures A concentration of dopant ions is present in the semiconductor body to form a first resistor and at least a second resistor. The method further comprises forming a pair of merged fins on outer portions of the doped regions of the first and at least second fin structures. The pair of merged fins is electrically connected so that the first and at least second resistors are electrically connected in parallel with each other.

In a third aspect of the invention, an integrated circuit including at least one parallel resistor circuit comprises first and at least second fin structures. Each of the first and at least second fin structures has a vertically oriented semiconductor body. The vertically oriented semiconductor body comprises vertical surfaces. The circuit further comprises a doped region in each of the first and at least second fin structures. A concentration of dopant ions is present in the semiconductor body to form a first resistor and at least a second resistor. The circuit further comprises a pair of merged fins formed on outer portions of the doped regions of the first and at least second fin structures. The pair of merged fins is electrically connected so that the first and at least second resistors are electrically connected in parallel with each other.

Advantageously, the above-described techniques provide for fin structures that do not require a redesign of current CMOS resistor schemes.

These and other objects, features, and advantages of the present invention will become apparent from the following detailed description of illustrative embodiments thereof, which is to be read in connection with the accompanying drawings.

DETAILED DESCRIPTION OF PREFERRED EMBODIMENTS

The present invention relates to a semiconductor structure including at least two resistors in parallel with each other. The semiconductor structure is compatible with finFET structures, and methods of manufacturing the same, which are described in detail in the accompanying figures. The finFETs may be dual gate finFETs or trigate finFETs. The term "fin" is used herein to denote a semiconductor material, which is employed as the body of the FET.

Figure 1:
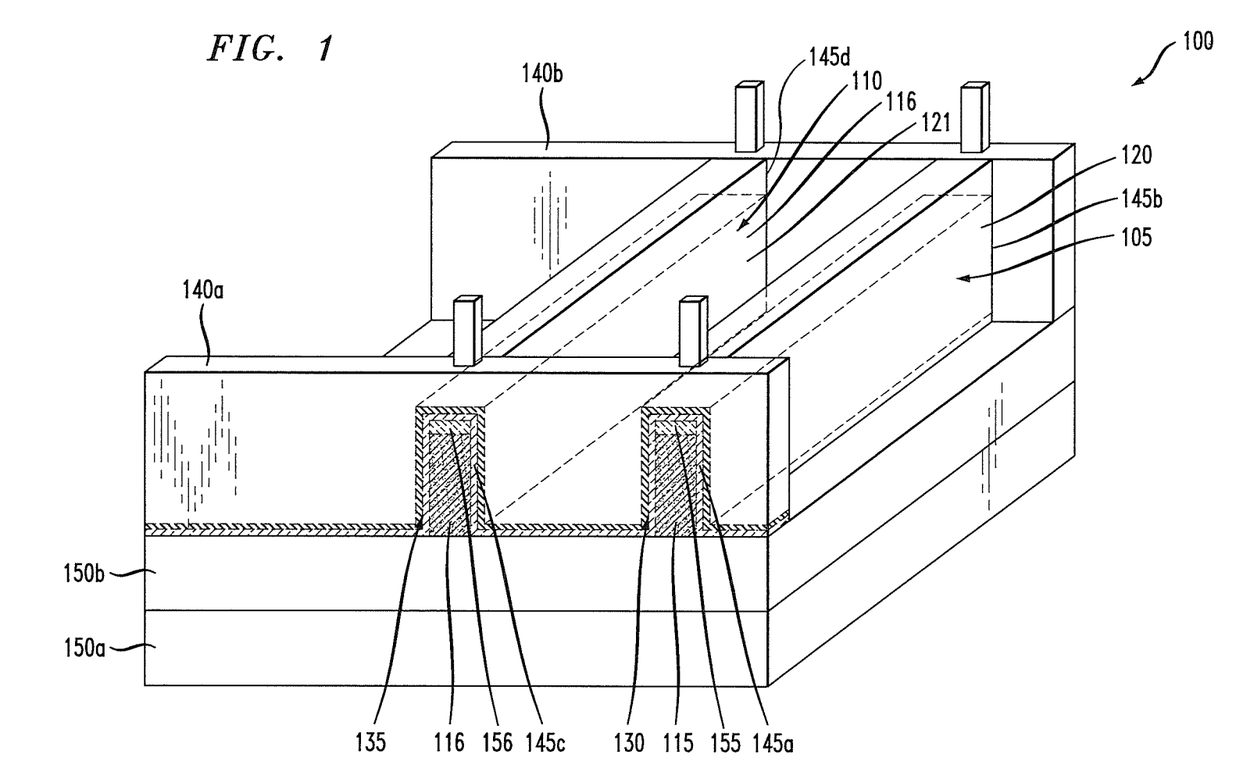
FIG. 1 shows a semiconductor structure in accordance with an illustrative embodiment of the present invention.

FIG. 1 shows an exemplary semiconductor structure 100 in accordance with an illustrative embodiment of the present invention. The semiconductor structure 100 includes first and at least second fin structures 105, 110. Each of the first and at least second fin structures 105, 110 has a vertically oriented semiconductor body 115, 116. Each of the vertically oriented semiconductor bodies 115, 116 includes vertical surfaces 120, 121. Reference numerals 120, 121 denote the exposed vertical surfaces of each of the fins 105, 110. A doped region in each of the first and at least second fin structures 105, 110 includes a concentration of dopant ions in the semiconductor body 115, 116 to form a first resistor and at least a second resistor 130, 135. Therefore, the first and at least second fin structures 105, 110 are the first and at least second resistors 130, 135, respectively.

A pair of merged fins 140a, 140b is formed on outer portions 145a-145d of the first and at least second fin structures 105, 110. The pair of merged fins 140a, 140b is electrically connected to the first and at least second fin structures 105, 110 in such a manner that the first and at least second resistors 130, 135 are electrically connected in parallel with each other.

Figure 2A:
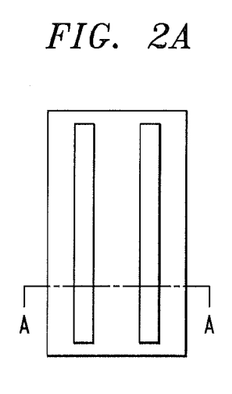
FIGS. 2A-2C show a top-down view (FIG. 2A), a cross-sectional view (FIG. 2B) along the plane A-A of FIG. 2A, and an isometric view (FIG. 2C) of the semiconductor structure in accordance with an illustrative embodiment of the present invention.

FIGS. 2A-8B illustrate various processing steps that are employed in the present invention in fabricating the semiconductor structure 100, which includes at least two resistors 130, 135 formed within a portion of the fin structures 105, 110, i.e., the thin vertically oriented semiconductor body 115, 116. FIG. 2A is a top-down view of the semiconductor structure 100. FIG. 2B is a cross-sectional view taken along the plane A-A of FIG. 2A. FIG. 2C is an isometric view of structure 100. FIG. 2B shows a structure 100 that includes substrate 150 having a patterned stack comprising a semiconductor body region 115, 116, i.e., fin 105, 110 (FIG. 1), and fin cap dielectric layer 155, 156 present atop the semiconductor body region 115, 116. It is noted that each fin 105, 110 (FIG. 1) is a vertically oriented semiconductor body, 115, 116 (FIG. 1), which includes exposed vertical surfaces 120, 121 (FIG. 1) and a top horizontal surface, which is protected by a fin cap dielectric layer 155, 156.

Figure 2B:
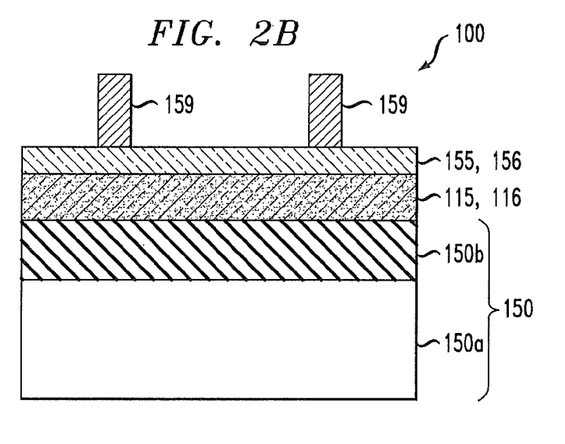
Figure 2C:
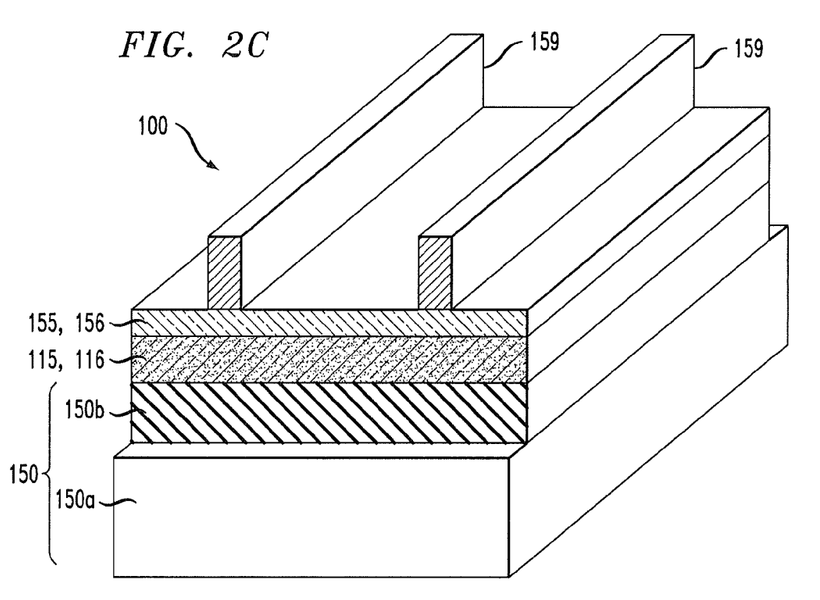

The substrate 150 includes upper portion 150b, which is comprised of an insulating material, which can be, but is not limited to, an oxide, nitride, oxynitride or multilayers thereof, and bottom portion 150a, which is comprised of a semiconducting material such as Silicon (Si) or silicon-germanium (SiGe). Regions 150 and fins 105, 110 (FIG. 1) may be part of an SOI (silicon-on-insulator) material. Alternatively, layers 150b and Fins 105, 110 are layers, which are separately deposited atop a semiconductor substrate.

The semiconductor body, i.e., fin region 105, 110, is comprised of any semiconducting material, which can be, but is not limited to, a single crystalline Si or SiGe. The fin cap dielectric layer 155, 156 is comprised of a dielectric material, which can be, but is not limited to, silicon oxide, silicon nitride, silicon oxynitride or multilayers thereof. The semiconductor body 115, 116 may have a vertical thickness of from approximately three hundred (300) Angstroms to approximately two thousand (2,000) Angstroms.

The structure shown in FIG. 2B is fabricated utilizing conventional processes well known to those skilled in the art. For example, the fin cap dielectric layer 155, 156 is formed atop a layer of semiconducting material 115, 116 by utilizing a conventional deposition process such as chemical vapor deposition (CVD), plasma-assisted CVD, or chemical solution deposition. Alternatively, fin cap dielectric layer 155, 156 may be grown on semiconductor body 115, 116 (i.e., fin 105, 110) utilizing a conventional thermal oxidation, nitridation or oxynitridation process well known to those skilled in the art.

Following formation of the fin cap dielectric layer material 155, 156 on the semiconductor body 115, 116, the structure 100 is subjected to conventional lithography (including applying a photoresist 159 to the fin cap dielectric layer 155, 156, exposing the photoresist 159 to a pattern of radiation, and developing the pattern into the photoresist 159 using a conventional resist developer) and dry etching such as reactive-ion etching, ion beam etching, plasma-etching or laser ablation. The etching step may include a single etching process or multiple etching processes to provide the structure illustrated in FIGS. 3A-3C. After etching, the photoresist 159 is removed from the structure utilizing a conventional stripping process well known to those skilled in the art.

Figure 3A:
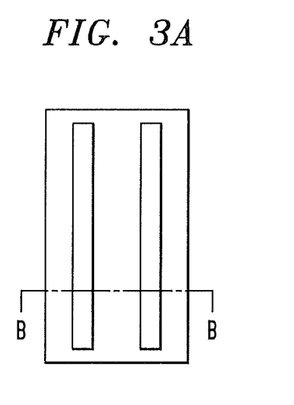
FIGS. 3A-3C show a top-down view (FIG. 3A), a cross-sectional view (FIG. 3B) along the plane B-B of FIG. 3A, and an isometric view (FIG. 3C) of the semiconductor structure in accordance with an illustrative embodiment of the present invention.
Figure 3B:
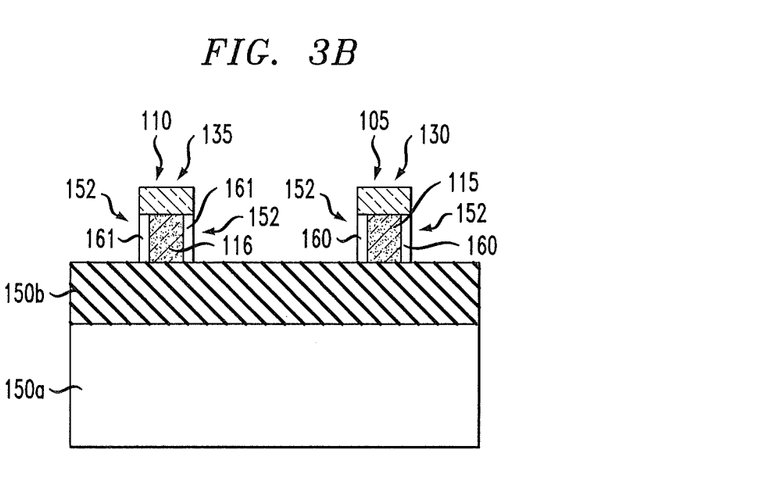
Figure 3C:
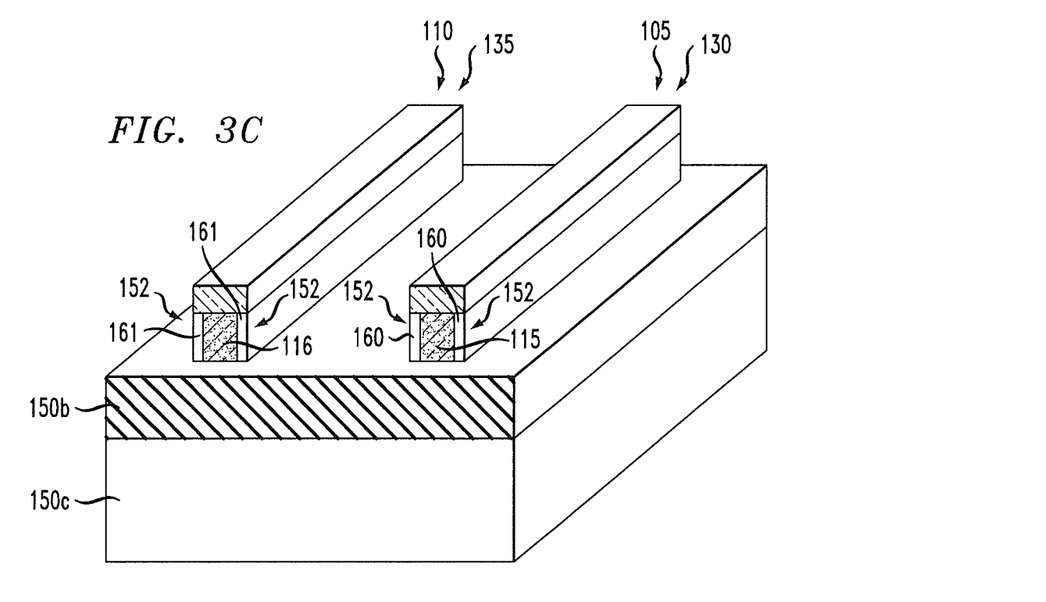

With fin cap dielectric layer 155, 156 protecting the top horizontal surface of vertically oriented semiconductor body 115, 116, i.e., the fin 105, 110, the structure 100 shown in FIG. 3B is then subjected to an implantation step where dopant ions (labeled as 152) are implanted into the exposed vertical surfaces of the semiconductor body 115, 116 to form doped region 160, 161 within the semiconductor body 115, 116. Note that the doped region 160, 161 extends inward from the vertical surfaces of the semiconductor body 115, 116. Specifically, doped region 160, 161 is formed in each exposed vertical surface of the semiconductor body 115, 116 using implant conditions in which the dopant concentration and implant energy is sufficient to penetrate into the exposed vertical surfaces of the semiconductor body 115, 116 without saturating the semiconductor body.

It is noted that the phrase "deep enough to penetrate the surface of the semiconductor body, without saturating the semiconductor body" denotes that the dopant ions used in the above-identified implant step are not implanted entirely through the semiconductor body. Hence, in the implantation step, the dopant ions are implanted so as to form implant regions, which are predominately located near the vertical sidewalls of the semiconductor body; the implant regions do not extend into the interior portion of the semiconductor body. With very thin fins, it would be quite easy to implant dopant ions such that the fin has a fairly uniform dopant concentration all the way through the fin (a "saturated fin"). However, saturated thin fins would result in a resistor whose resistance is heavily independent on Fin thickness. The depth and concentration for each fin would be approximately equal, resulting in a substantially identical total dopant dose in each fin. However, after annealing, the thicker fins may have dopant dose distributed over a thicker fin, resulting in a lower final dopant concentration.

It should be understood that the dose of the implant can be used to adjust the resulting resistance for each doped region 160, 161 within the semiconductor body 115, 116. For example, Table I shows the dopant concentration for three resistors. The dopant ion employed may be either an n-type dopant or a p-type dopant. In one embodiment, boron implantation at a dose of from approximately 1 E14 atoms/cm$^2$ to approximately 5 E15 atoms/cm$^2$ is carried out at energy levels from approximately five (5) Kiloelectron-Volt (KeV) to approximately ten (10) KeV. It should be understood that the doped region 115 of the first fin structure 105 may have a different dopant type or the same dopant type as the doped region 116 of the at least second fin structure 110. The doped semiconductor body 115, 116 can be formed by a blanket deposition process such as chemical vapor deposition, physical vapor deposition, plasma doping or a combination thereof.

TABLE I

| Doping concentration (/cm$^3$) | Sheet resistance (ohms/sq) | Total resistance of fin (kohm): Fin length = 0.5 micrometer (μm); Fin width = 10 μm; Fin length = 30 nanometer (nm) |
| --- | --- | --- |
| 1E+19 | 4655 | 232.75 |
| 5E+19 | 925 | 46.25 |
| 1E+20 | 473 | 23.67 |

The implant step may be carried out using a maskless or masked ion implantation process.

Following the implantation step, the structure 100 is subjected to a rapid thermal anneal (RTA) process at, for example, approximately one thousand (1,000) degrees Celsius for about five (5) seconds, which serves to diffuse the dopant ions through the fin to a predetermined depth, which is independent on the thickness of the fin as well as the concentration of the dopant ion. For example, the activation annealing step is performed in an inert atmosphere such as helium (He), argon (Ar) or a mixture thereof at a temperature of about seven hundred (700) degrees Celsius or higher for a time period of approximately one (1) minute or greater.

Figure 4A:
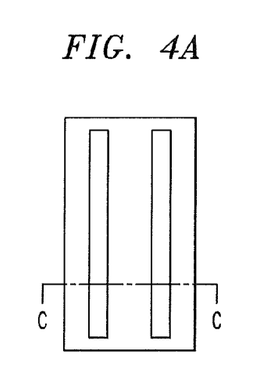
FIGS. 4A-4C show a top-down view (FIG. 4A), a cross-sectional view (FIG. 4B) along the plane C-C of FIG. 4A, and an isometric view (FIG. 4C) of the semiconductor structure in accordance with an illustrative embodiment of the present invention.
Figure 4B:
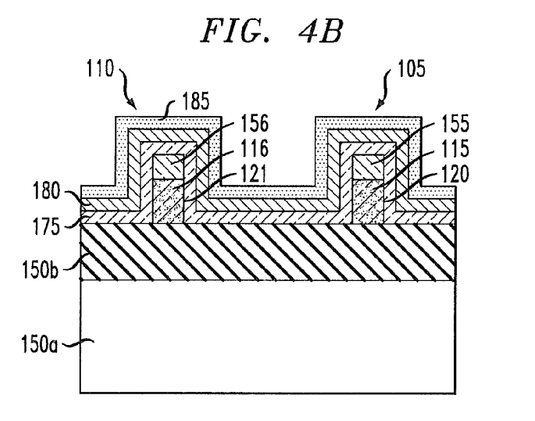
Figure 4C:
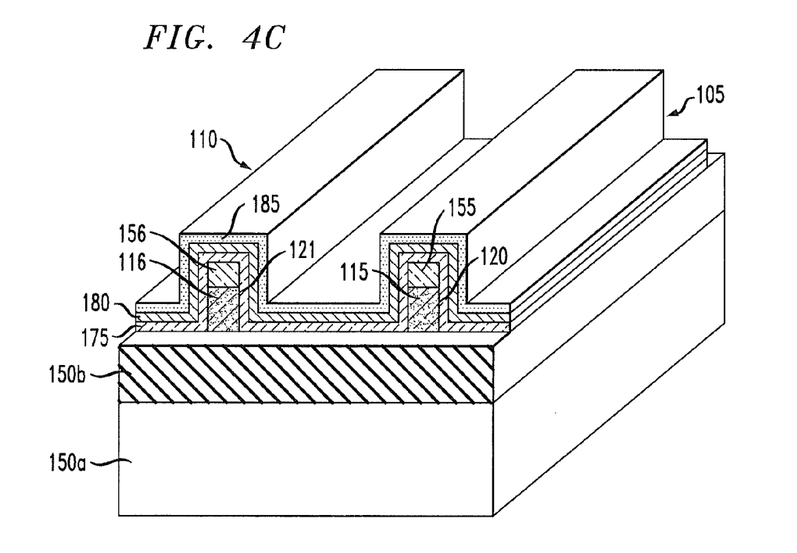
Figure 5A:
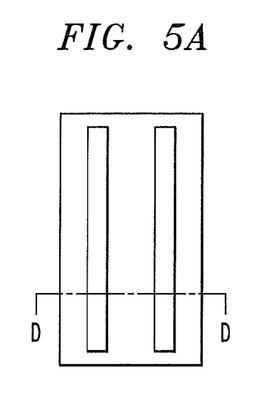
FIGS. 5A-5D show a top-down view (FIG. 5A), a cross-sectional view (FIG. 5B) along the plane D-D of FIG. 5A, and two isometric views (FIGS. 5C-5D) of the semiconductor structure in accordance with an illustrative embodiment of the present invention.
Figure 5B:
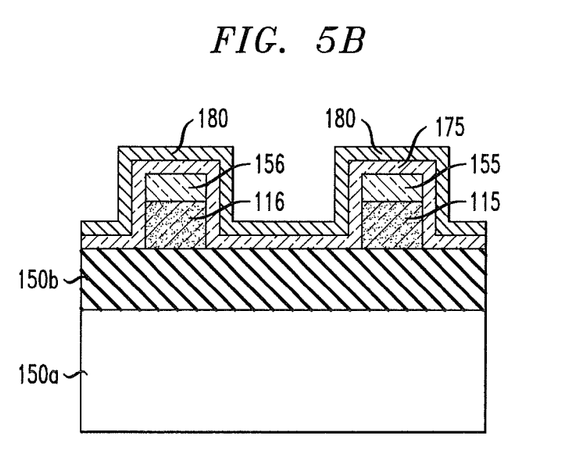
Figure 5C:
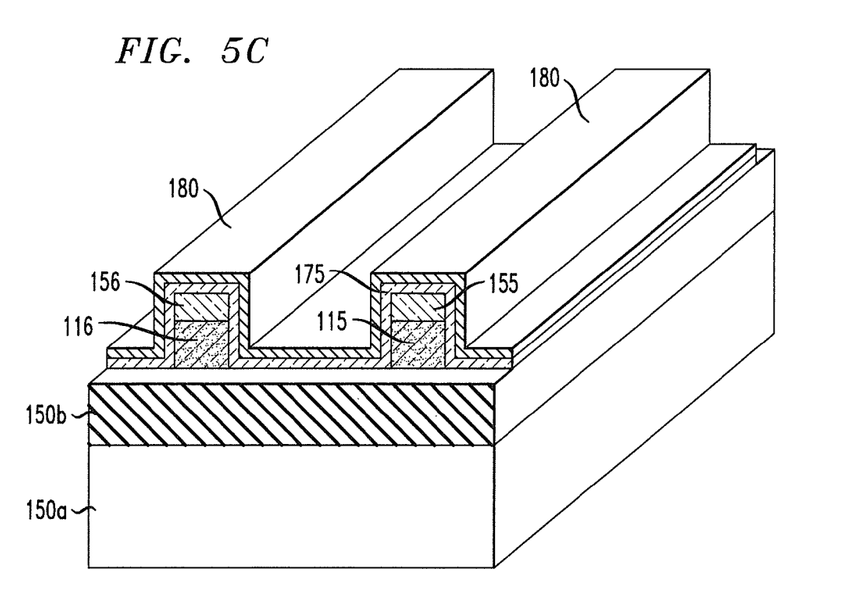
Figure 5D:
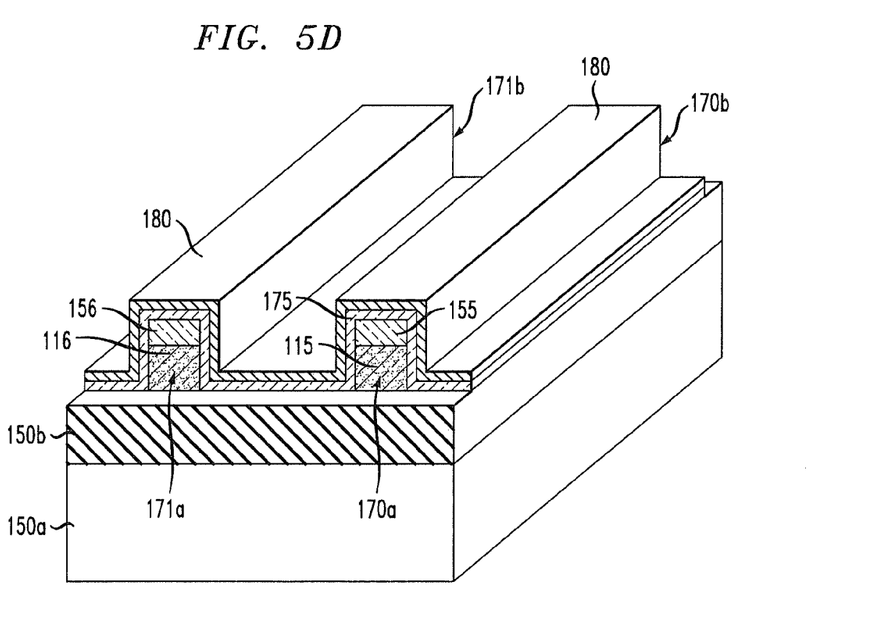

Referring to FIGS. 4A-4C, after the annealing process, a dielectric layer 175 is formed atop the vertically oriented semiconductor body 115, 116. The dielectric layer 175 includes a dielectric material, which can be, but is not limited to, hafnium oxide. The dielectric layer 175 contacts the semiconductor body 115, 116 of the first and at least second fin structures 105, 110 at the vertical surfaces and top horizontal surfaces of the semiconductor bodies 115, 116; and lower horizontal surfaces that are in-between the vertical surfaces 120, 121 of the first and at least second fin semiconductor body 115, 116.

Following the deposition of the dielectric layer 175, a conductive layer 180 is formed atop of the dielectric layer 175. The conductive layer 180 is composed of a conductive material, which can be, but is not limited to, Titanium Nitride (TiN), Tantalum Nitride (TaN), Tungsten Nitride (WN), Titanium Aluminum Nitride (TiAlN), Tantalum Carbon Nitride (TaCN), Cobalt Tungsten Phosphide (CoWP), Titanium (Ti), Tantalum (Ta), Tungsten (W), or a combination thereof is formed atop the entire structure shown in FIGS. 5A-5D utilizing a conventional deposition process well known to those skilled in the art. The dielectric layer 175 and conductive layer 180 may be formed by utilizing a conventional deposition process such as chemical vapor deposition (CVD), physical deposition (sputtering), plasma-assisted CVD, atomic layer deposition, or chemical solution deposition. The resultant structure that is formed is shown in FIGS. 4A-4C.

Next, a patterned masking layer 185 is formed atop a portion of the structure shown in FIGS. 4A-4C so as to provide the structure shown, for example, in FIGS. 5A-5D. Note this resultant structure still contains the patterned stack (conductive layer 180, dielectric layer 175, fin cap dielectric layer 155, 156 and semiconductor body 115, 116) and that patterned masking layer 185 protects a portion of the conductive layer 180, dielectric layer 175, fin cap dielectric layer 155, 156 and semiconductor body 115, 116, while leaving end portions of the patterned stack exposed.

A photoresist, not shown, is applied to the masking layer 185, and conventional lithography and etching are employed in forming the patterned masking layer. After the etching step, the photoresist is removed from the structure providing the structure illustrated in FIGS. 5A-5D.

The conductive layer 180, which is not protected by the patterned masking layer 185, is removed from the structure utilizing a conventional etching process, which is selective in removing the conductive layer from the structure. The resultant structure that is formed after portions of the conductive layer 180 have been removed from the structure 100 is shown, for example, in FIG. 5D. Note that the structure shown in FIG. 5D has exposed end portions 170a, 170b, 171a and 171b of the semiconductor body 115, 116 that are not protected by patterned masking layer 185.

Figure 6A:
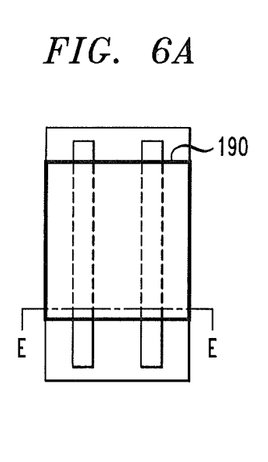
FIGS. 6A-6C show a top-down view (FIG. 6A), a cross-sectional view (FIG. 6B) along the plane E-E of FIG. 6A, and an isometric view (FIG. 6C) of the semiconductor structure in accordance with an illustrative embodiment of the present invention.
Figure 6B:
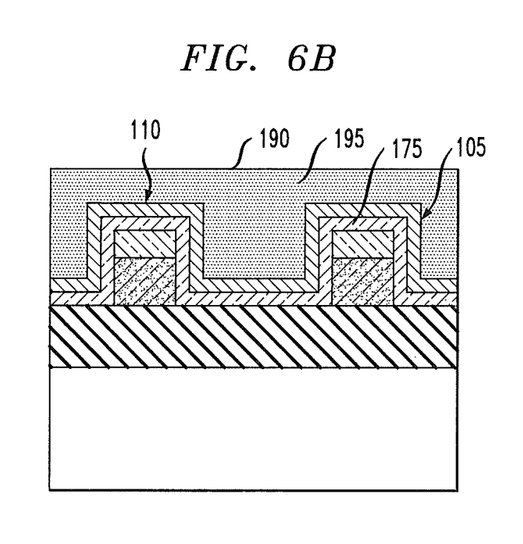
Figure 6C:
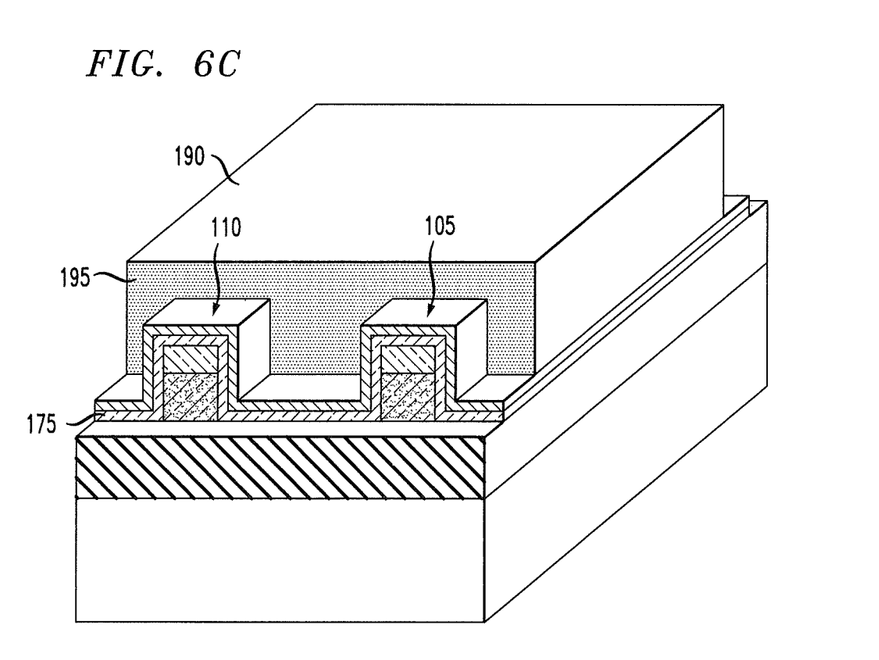

The patterned masking layer 185 is then removed using conventional processes well known to those skilled in the art. A thick film of polycrystalline silicon, or polysilion (also known as poly-Si or poly) 190 is formed over part of the fin structures 105, 110 as shown in FIGS. 6A-6C. The thick film of polycrystalline silicon 190 is then subjected to an implantation step where dopant ions (labeled as 195) are implanted into the polycrystalline silicon 190. The doped Poly 190 over fin structures 105, 110 may be a gate electrode for a fin transistor. The doped Poly 190 may also protect other implants that may be formed later in a finFET standard process flow, for example, adding a source/drain implantation.

Figure 7A:
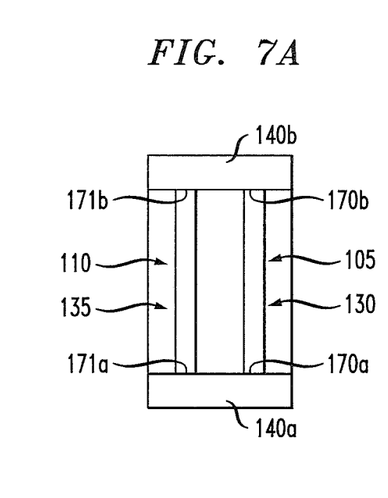
FIGS. 7A-7B show a top-down view (FIG. 7A) and an isometric view (FIG. 7B) of the semiconductor structure with the pair of merged fins in accordance with an illustrative embodiment of the present invention.
Figure 7B:
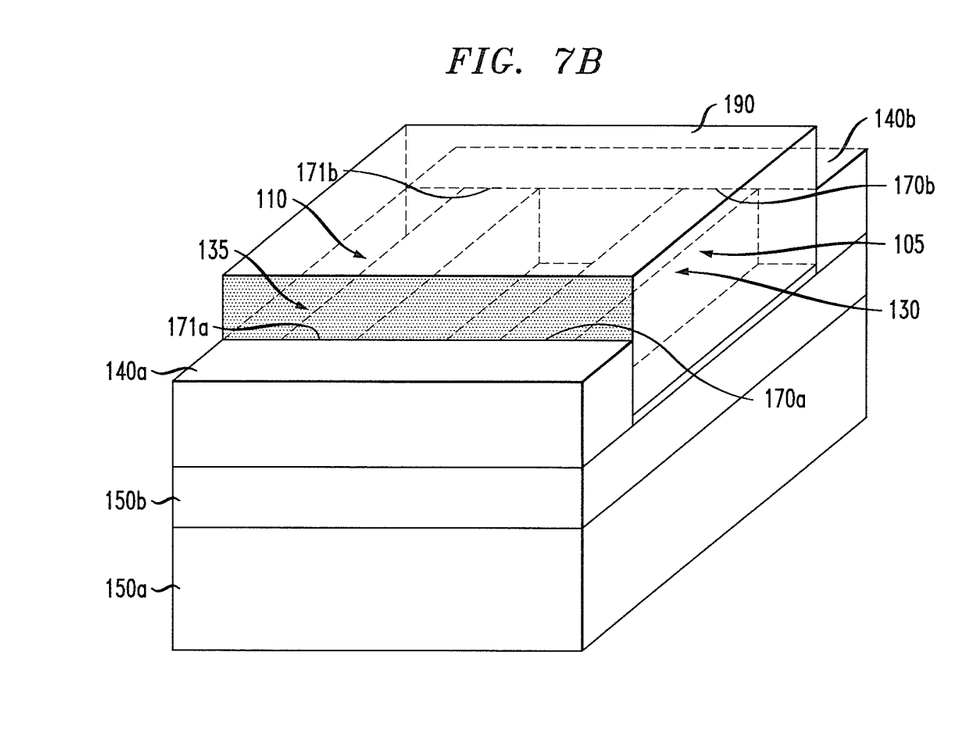

After the doped poly 190 is formed, a pair of merged fins 140a, 140b is formed as shown in FIGS. 7A-7B. The merged fins 140a, 140b is composed of a conductive material, which can be, but is not limited to, TiN, TaN, WN, TiAlN, TaCN, CoWP, Ti, Ta, W, or a combination thereof is formed utilizing a conventional deposition process well known to those skilled in the art.

The merged fins 140a, 140b is substantially perpendicular to the first and second fin structures 105, 110. The fin structures 105, 110 are the first and second resistors 130, 135, respectively. The pair of merged fins 140a, 140b is formed with the end portions 170a, 170b, 171a, 171b of the first and second fin structures 105, 110. The merged fins 140a, 140b are electrically connected to the first and second fin structures 105, 110 in such a manner that the first and at least second resistors 130, 135 are electrically connected in parallel with each other. The height of the merged fins 140a, 140b may be the same height as the first and at least second fin structures 105, 110.

Figure 8A:
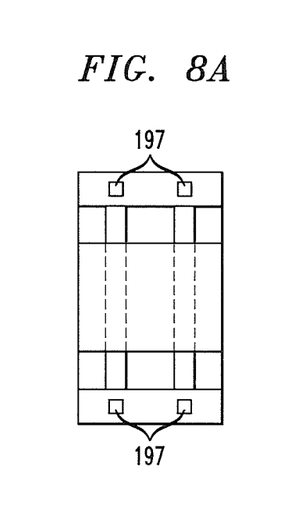
FIGS. 8A-8B show a top-down view (FIG. 8A) and an isometric view (FIG. 8B) of the semiconductor structure with contacts in accordance with an illustrative embodiment of the present invention.
Figure 8B:
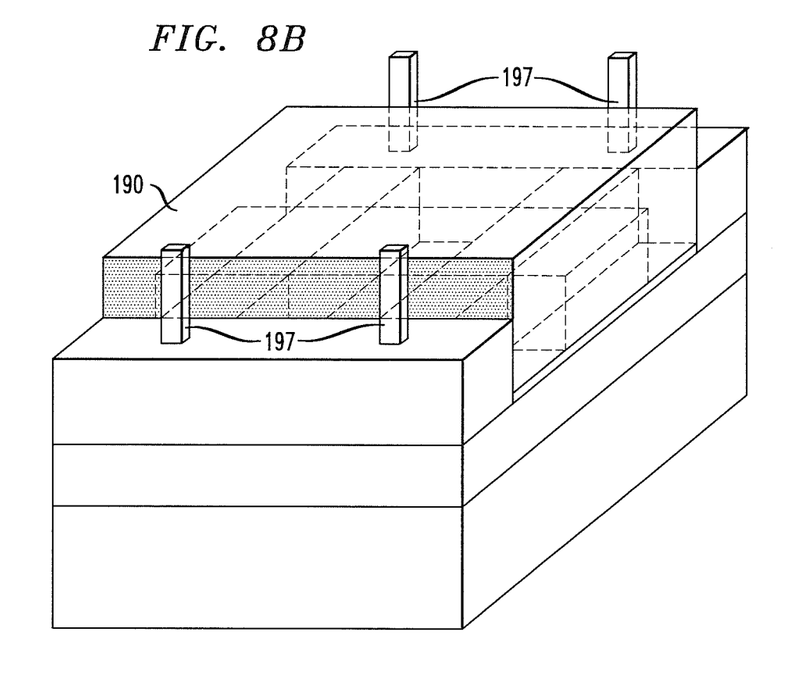

After the pair of merged fins 140a, 140b is formed, at least one contact 197 is formed onto the pair of merged fins 140a, 140b as shown in FIGS. 8A-8B. Various contacts can also be formed via holes (not shown) that are formed in the dielectric layer 175 and filled with metal to form various contacts.

Figure 9:
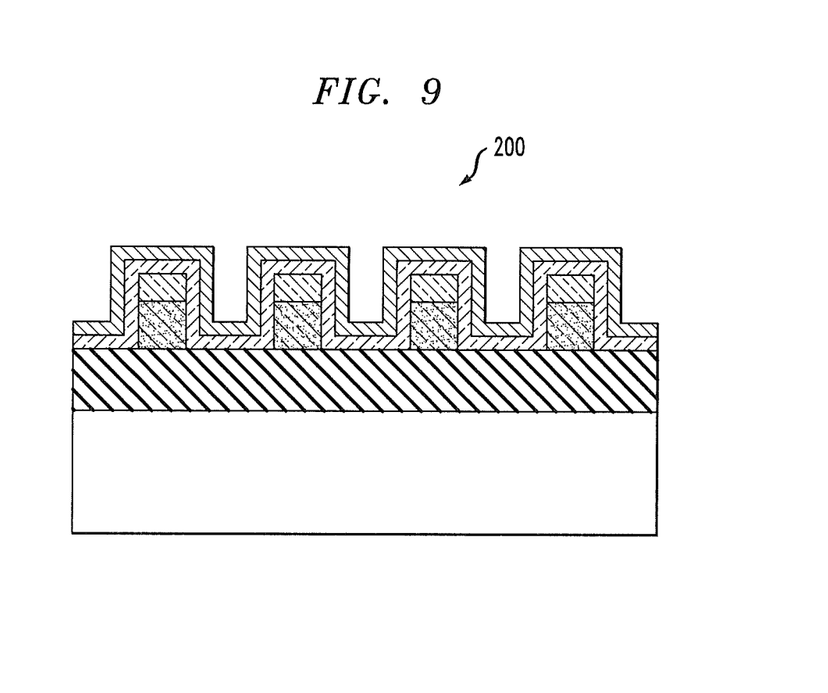
FIG. 9 shows a view of another semiconductor structure having more than two resistors connected in parallel in accordance with an illustrative embodiment of the present invention.

FIG. 9 illustrates another embodiment of a structure 200. The structure 200 is similar to the structure 100 except that there are more than two resistors being formed in a parallel resistor circuit.

Figure 10:
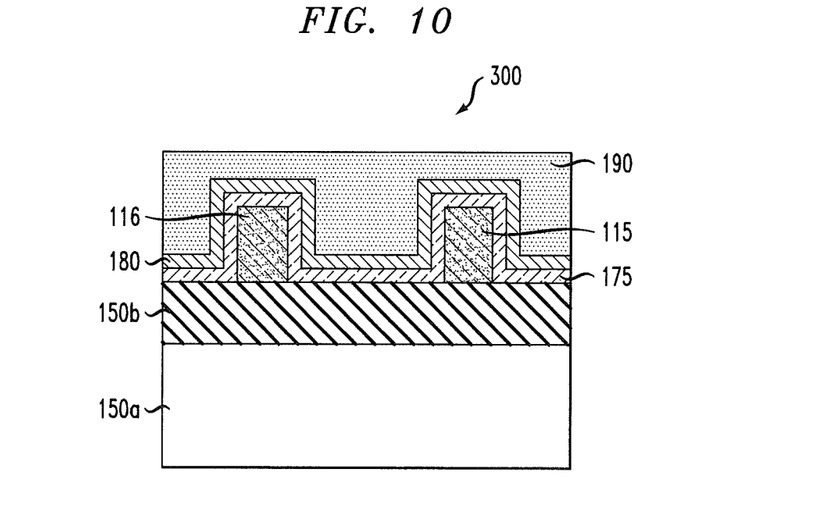
FIG. 10 shows a view of another semiconductor structure without the fin cap dielectric layer in accordance with an illustrative embodiment of the present invention.

FIG. 10 illustrates another embodiment of a structure 300. The structure 300 is similar to the structure 100 except that the fin cap dielectric layer 155, 156 is not formed in the structure 300. In other words, the fin cap dielectric layer 155, 156 that is in structure 100 is omitted in structure 300.

Figure 11:
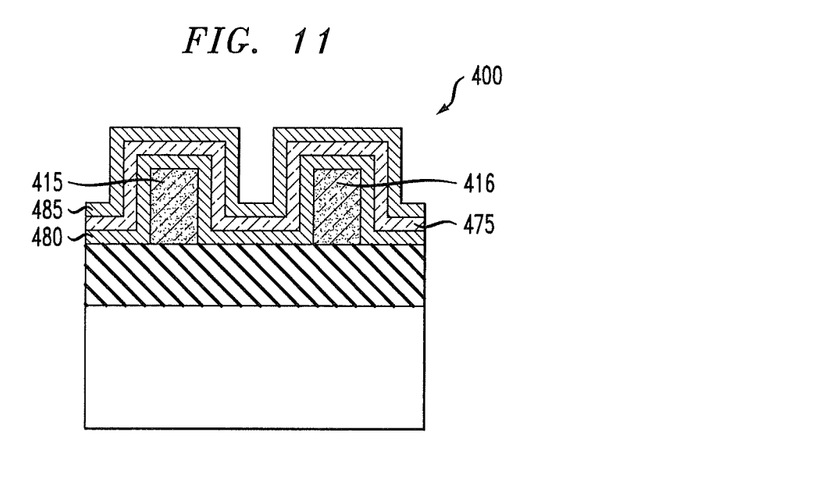
FIG. 11 shows a view of another semiconductor structure with two conductive plates in accordance with an illustrative embodiment of the present invention.

FIG. 11 illustrates another embodiment of a structure 400. The structure 400 is similar to the structure 300 except after the semiconductor bodies 415, 416 are formed, a first conductive layer 480 is formed over the semiconductor bodies 415, 416. A dielectric layer 475 is then formed over the first conductive layer 480 and finally a second conductive layer 485 is formed over the dielectric layer 475. The material and process of forming the dielectric layer 475 and the first and second conductive layers 480, 485 are similar to those described with reference to structure 100.

Figure 12:
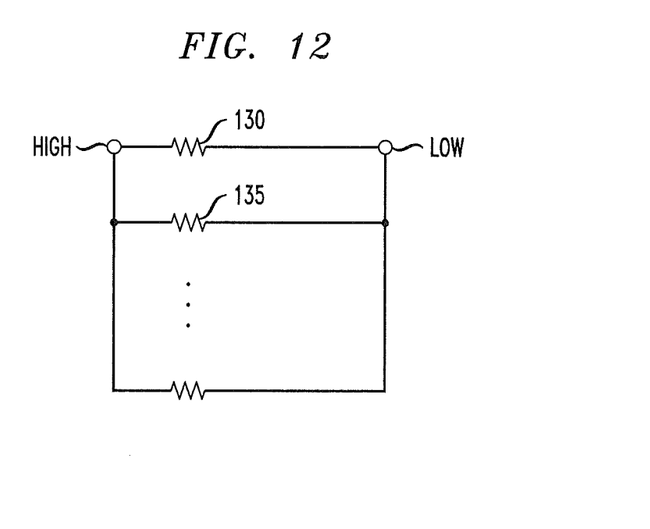
FIG. 12 shows a parallel resistor circuit diagram of a semiconductor structure in accordance with an illustrative embodiment of the present invention.

FIG. 12 illustrates a schematic diagram showing a parallel resistor circuit diagram of structure 100. The structure 100 may further include a capacitor in series with each of the resistors. The forming of a capacitor, such as a metal-insulator-metal capacitor (MIMCAP) compatible with a finFET structure is disclosed in U.S. application Ser. No. 12/793,292, filed Jun. 3, 2010, the disclosure of which is incorporated by reference herein.

At least a portion of the parallel resistor circuit of the present invention may be implemented in an integrated circuit. In forming integrated circuits, a plurality of identical die is typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

It will be appreciated and should be understood that the exemplary embodiments of the invention described above can be implemented in a number of different fashions. Given the teachings of the invention provided herein, one of ordinary skill in the related art will be able to contemplate other implementations of the invention. Indeed, although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A structure comprising:
a parallel resistor circuit element comprising:
first and at least second fin structures, each of the first and at least second fin structures having a vertically oriented semiconductor body, the vertically oriented semiconductor body comprising vertical surfaces;
a doped region in each of the first and at least second fin structures comprising a concentration of dopant ions present in the semiconductor body to form a first resistor and at least a second resistor, the dopant ions imparting conductivity to the first and at least second fin structures; and
a pair of merged fins formed on outer portions of the doped regions of the first and at least second fin structures, the pair of merged fins being electrically connected so that the first and at least second resistors are electrically connected in parallel with each other;
wherein the doped regions in each of the first and at least second fin structures extend continuously between the pair of merged fins;
wherein the concentration of dopant ions in the doped regions is substantially uniform along a length of each of the first and at least second fin structures between the pair of merged fins; and
wherein the dopant ions of the first and at least second fin structures are diffused into the semiconductor bodies of the first and at least second fin structures to a predetermined depth to form the respective doped regions, the predetermined depth being less than the respective thicknesses of the semiconductor bodies such that each of the semiconductor bodies comprises an interior region separate from the respective doped regions.

2. The structure of claim 1, wherein each of the doped regions of the first and at least second fin structures is presented in the vertically oriented semiconductor body that extends inward from the vertical surfaces.

3. The structure of claim 1, wherein each semiconductor body of the first and at least second fin structures has a fin cap dielectric layer atop a horizontal surface.

4. The structure of claim 3, wherein the fin cap dielectric layer is comprised of $SiO_2$.

5. The structure of claim 1, wherein the first and at least second fin structures are located on an insulator material layer of a substrate.

6. The structure of claim 1, wherein the semiconductor bodies of the first and at least second fin structures include:
a dielectric layer contacting the semiconductor bodies of the first and at least second fin structures at the vertical surfaces and top horizontal surfaces of the semiconductor bodies and lower horizontal surfaces that are in-between the vertical surfaces of the first and at least second fin semiconductors bodies; and
a conductive plate contacting the dielectric layer.

7. The structure of claim 6, wherein the conductive plate is comprised of TiN, TaN, or WN.

8. The structure of claim 6, wherein the dielectric layer is comprised of $HfO_2$.

9. The structure of claim 1, wherein the pair of merged fins includes a plurality of contacts on a top surface of the pair of merged fins.

10. The structure of claim 1, wherein the pair of merged fins is comprised of silicon.

11. The structure of claim 1, wherein the semiconductor bodies of the first and at least second fin structures include:
a first conductive plate contacting the semiconductor bodies of the first and at least second fin structures at the vertical surfaces and top horizontal surfaces of the semiconductor bodies and lower horizontal surfaces that are in-between the vertical surfaces of the first and at least second fin semiconductor bodies;
a dielectric layer contacting the first conductive plate; and
a second conductive plate contacting the dielectric layer.

12. The structure of claim 11, wherein the first and second conductive plates are comprised of W, TiN, TaN, or WN.

13. The structure of claim 1, wherein each of the semiconductor bodies of the first and at least second fin structures is comprised of single crystalline Si or SiGe.

14. The structure of claim 1, wherein each of the first and at least second fin structures has a respective height which is greater than its respective width.

15. The structure of claim 1, wherein the parallel resistor circuit element is free of a gate electrode.

16. The structure of claim 1, wherein the first and at least second fin structures comprise a first material and the pair of merged fins comprise a second material different than the first material.

17. The structure of claim 16, wherein the first material comprises a semiconducting material and the second material comprises a conductive material.

18. The structure of claim 17, wherein:
the semiconducting material comprises one or more of Silicon (Si) and Silicon-Germanium (SiGe);and
the conductive material comprises one or more of Titanium Nitride (TiN), Tantalum Nitride (TaN), Tungsten Nitride (WN), Titanium Aluminum Nitride (TiAlN), Tantalum Carbon Nitride (TaCN), Cobalt Tungsten Phosphide (CoWP), Titanium (Ti), Tantalum (Ta), and Tungsten (W).

19. A integrated circuit comprising:
a parallel resistor circuit comprising:
first and at least second fin structures, each of the first and at least second fin structures having a vertically oriented semiconductor body, the vertically oriented semiconductor body comprising vertical surfaces;
a doped region in each of the first and at least second fin structures comprising a concentration of dopant ions present in the semiconductor bodies to form a first resistor and at least a second resistor, the dopant ions imparting conductivity to the first and at least second fin structure; and
a pair of merged fins formed on outer portions of the doped regions of the first and second fin structures, the pair of merged fins being electrically connected so that the first and at least second resistors are electrically connected in parallel with each other;
wherein the doped regions in each of the first and at least second fin structures extend continuously between the pair of merged fins;
wherein the concentration of dopant ions in the doped regions is substantially uniform along a length of each of the first and at least second fin structures between the pair of merged fins; and
wherein the dopant ions of the first and at least second fin structures are diffused into the semiconductor bodies of the first and at least second fin structures to a predetermined depth to form the respective doped regions, the predetermined depth being less than the respective thicknesses of the semiconductor bodies such that each of the semiconductor bodies comprises an interior region separate from the respective doped regions.

20. A parallel resistor circuit comprising:
a plurality of fin structures, each of the plurality of fin structures having a vertically oriented semiconductor body, the vertically oriented semiconductor body comprising vertical surfaces;
a doped region in each of the plurality of fin structures comprising a concentration of dopant ions present in the semiconductor body to form a plurality of resistors, the dopant ions imparting conductivity to the plurality of fin structures; and
a pair of merged fins formed on outer portions of the doped regions of the plurality of fin structures, the pair of merged fins being electrically connected so that the plurality of resistors are electrically connected in parallel with each other;
wherein the doped regions in each of the plurality of fin structures extend continuously between the pair of merged fins;
wherein the concentration of dopant ions in the doped regions is substantially uniform along a length of each of the plurality of fin structures between the pair of merged fins; and
wherein the dopant ions of the first and at least second fin structures are diffused into the semiconductor bodies of the first and at least second fin structures to a predetermined depth to form the respective doped regions, the predetermined depth being less than the respective thicknesses of the semiconductor bodies such that each of the semiconductor bodies comprises an interior region separate from the respective doped regions.

* * * * *